United States Patent
Hong et al.

(10) Patent No.: US 7,759,236 B2
(45) Date of Patent: Jul. 20, 2010

(54) FLASH MEMORY DEVICE AND METHOD OF MANUFACTURING THE SAME

(75) Inventors: Kwon Hong, Seongnam-si (KR); Eun Shil Park, Namyangju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 0 days.

(21) Appl. No.: 11/479,062

(22) Filed: Jun. 30, 2006

(65) Prior Publication Data

US 2007/0158738 A1    Jul. 12, 2007

(30) Foreign Application Priority Data

Dec. 29, 2005    (KR) .................. 10-2005-0133073

(51) Int. Cl.
*H01L 21/3205*    (2006.01)

(52) U.S. Cl. ............... 438/591; 438/201; 438/211; 438/257; 438/261; 257/E29.3

(58) Field of Classification Search ............... 257/48, 257/758, 72, 316, 314, 315, 321, 324, 325; 438/201, 211, 257, 261, 591
See application file for complete search history.

(56) References Cited

U.S. PATENT DOCUMENTS

| | | | |
|---|---|---|---|
| 5,928,786 A * | 7/1999 | Mukogawa et al. | 428/409 |
| 6,667,508 B2 * | 12/2003 | Lin et al. | 257/315 |
| 6,849,925 B1 * | 2/2005 | Halliyal et al. | 257/635 |
| 7,068,544 B2 * | 6/2006 | Forbes et al. | 365/185.33 |
| 7,122,430 B2 * | 10/2006 | Sato et al. | 438/257 |
| 7,238,574 B1 * | 7/2007 | Hong et al. | 438/261 |
| 2003/0030099 A1 | 2/2003 | Hsieh et al. | |
| 2004/0051134 A1 | 3/2004 | Jang et al. | |
| 2005/0026349 A1 | 2/2005 | Forbes et al. | |
| 2005/0057136 A1 * | 3/2005 | Moriya et al. | 313/311 |
| 2005/0285180 A1 * | 12/2005 | Mitani et al. | 257/315 |
| 2006/0231017 A1 * | 10/2006 | Vaartstra | 117/105 |
| 2006/0267075 A1 * | 11/2006 | Sandhu et al. | 257/316 |

FOREIGN PATENT DOCUMENTS

KR    1020040093606 A    11/2004

OTHER PUBLICATIONS

State Intellectual Property Office, The First Office Action, Application No. 2006101082131, Apr. 18, 2008.

* cited by examiner

*Primary Examiner*—Wai-Sing Louie
(74) *Attorney, Agent, or Firm*—Townsend and Townsend and Crew LLP

(57) ABSTRACT

A flash memory device and a method of manufacturing the same is disclosed. A gate dielectric film formed between a floating gate and a control gate of a flash memory device is formed by laminating an oxide film and a $ZrO_2$ film. Accordingly, the reliability of the flash memory can be improved while securing a high coupling ratio.

18 Claims, 3 Drawing Sheets

FLASH MEMORY DEVICE AND METHOD OF MANUFACTURING THE SAME

BACKGROUND

The present invention generally relates to a flash memory device and a method of manufacturing the same, in which the reliability of the flash memory device can be improved while securing a high coupling ratio.

In general, a semiconductor memory device is largely classified into a volatile memory and a non-volatile memory.

The volatile memory includes Random Access Memory (RAM), such as Dynamic Random Access Memory (DRAM) and Static Random Access Memory (SRAM). The volatile memory has the properties that data can be input and retained when being powered, but data become volatile and cannot be retained when not being powered.

In the DRAM, the transistor is responsible for the switch function and the capacitor is responsible for the data storage function. If power is not supplied, internal data within the DRAM are automatically lost. In addition, the SRAM has the transistor structure of a flip flop type. Data are stored according to the difference in the degree of driving between the transistors. Internal data within the SRAM are also automatically lost.

In contrast, the non-volatile memory that does not lose stored data even if power is not supplied has been developed in order for a developer to develop data or an operating system relating to the operation of the system and to supply the developed data or operating system. Examples of the non-volatile memory may include Programmable ROM (PROM), Electrically Programmable ROM (EPROM), and Electrically EPROM (EEPROM). Of them, there is a tendency that the demand for flash memory devices capable of programming and erasing data electrically has increased.

The flash memory device is an advanced type of EEPROM that can be erased electrically at high speed while not being removed from a circuit board. The flash memory device is advantageous in that it has a simple memory cell structure, has a low manufacturing cost per memory, and can retain data even if power is not supplied.

A general flash memory cell has a structure in which a tunnel oxide film, a floating gate, a gate dielectric film, and a control gate are sequentially laminated on a semiconductor substrate. The gate dielectric film is formed of an Oxide Nitride Oxide (ONO) film.

The properties of the flash memory cell may be varied significantly depending on the contact area of the floating gate and the semiconductor substrate with the tunnel oxide film therebetween, a thickness of the tunnel oxide film, the contact area of the floating gate and the control gate, and a thickness of the gate dielectric film.

Major characteristics of the flash memory cell may include the program rate, the erase rate, the distribution of program cells, and the distribution of erase cells. The reliability-related characteristics may include program/erase endurance, data retention, and so on.

In general, the program and erase rates are dependent on the ratio of a capacitance $C_{tunnel}$ between the semiconductor substrate and the floating gate and a capacitance $C_{ONO}$ between the floating gate and the control gate. In more detail, the program and erase rates (or speeds) are proportional to the coupling ratio coupling ratio. The coupling ratio can be expressed in the following equation.

$$\text{coupling ratio} = \frac{C_{ONO}}{C_{tunnel} + C_{ONO}}$$

To obtain high program and erase rates at a predetermined operating voltage, it is necessary to secure a high coupling ratio. To this end, it is necessary to reduce $C_{tunnel}$ or increase $C_{ONO}$.

As the design rule of the flash memory device decreases, the step of the floating gate is reduced in order to lower the interference when implementing multi-level cells in devices of 50 nm or less.

If the step of the floating gate reduces, however, the overlapped area between the floating gate and the control gate reduces. Accordingly, $C_{ONO}$ is lowered and the coupling ratio becomes small accordingly.

If the thickness of the gate dielectric film is reduced, $C_{ONO}$ is increased and the coupling ratio can be improved accordingly. However, the flash memory device uses a high bias voltage unlike the DRAM. Accordingly, if the thickness of the gate dielectric film reduces, the leakage current is increased and program/erase endurance and data retention are degraded accordingly. It is therefore difficult to secure the reliability of devices.

Furthermore, in the case where the gate dielectric film is formed using a high dielectric layer having a high dielectric constant, the degradation of the reliability of devices, which is incurred by a reduction in the thickness of the gate dielectric film, can be prevented. However, a problem arises because it is difficult to meet the coupling ratio.

SUMMARY OF THE INVENTION

An embodiment of the present invention provides a flash memory device and a method of manufacturing the same, in which the reliability of the flash memory device can be improved while securing a high coupling ratio.

Another embodiment of the present invention provides a flash memory device and a method of manufacturing the same, in which they can easily meet the coupling ratio.

According to an embodiment of the present invention, a flash memory device comprises a tunnel dielectric film, a floating gate, a gate dielectric film, and a control gate laminated on a semiconductor substrate, wherein the gate dielectric film includes a lamination film comprising at least one oxide film and a $ZrO_2$ film. In some embodiments, the lamination film comprises the $ZrO_2$ film on top of a first oxide film. In other embodiments, the lamination film comprises the $ZrO_2$ film located in between the first oxide film and a second oxide film. In still other embodiments, the lamination film comprises the first oxide film on top of the $ZrO_2$ film.

According to another embodiment of the present invention, a method of manufacturing a flash memory device comprises forming a tunnel dielectric film and a first conductive film on a semiconductor substrate, forming a gate dielectric film on the first conductive film, the gate dielectric film including a $ZrO_2$ film and at least one oxide film, and forming a second conductive film on the resulting structure.

In another embodiment, a non-volatile memory device includes a tunnel dielectric layer provided over a substrate; a floating gate formed over the tunnel dielectric film; a gate dielectric layer formed over the floating gate, the gate dielectric layer including at least one oxide film and at least one ZrO2 film; and a control gate formed over the gate dielectric layer. The gate dielectric layer comprises a first oxide film formed over the floating gate and the $ZrO_2$ film formed over the first oxide film. The gate dielectric layer further comprises a second oxide film provided over the $ZrO_2$ film. Alternatively, the oxide film is formed over the $ZrO_2$ film.

In another embodiment, a method of manufacturing a non-volatile memory device includes forming a tunnel dielectric film over a semiconductor substrate. A first conductive layer is formed over the tunnel dielectric film to form a floating gate. A gate dielectric layer is formed over the first conductive layer, the gate dielectric layer comprising a ZrO2 film and at least one oxide film. A second conductive film is formed over the gate dielectric layer to form a control gate.

BRIEF DESCRIPTION OF THE DRAWINGS

A more complete appreciation of the invention will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

FIGS. 1A to 1D are cross-sectional views illustrating a method of manufacturing a flash memory cell according to one embodiment of the present invention.

Figure 1A:
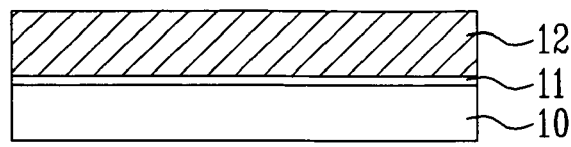
FIGS. 1A to 1D are cross-sectional views illustrating a method of manufacturing a flash memory cell according to one embodiment of the present invention.

Referring first to FIG. 1A, a tunnel oxide film 11 (or tunnel dielectric film 11) and a first conductive film 12 are sequentially formed on a semiconductor substrate 10. The first conductive film 12 serves as a floating gate and may be deposited to a thickness of about 500 angstroms to about 2000 angstroms using polysilicon by means of a Chemical Vapor Deposition (CVD) method.

Figure 1B:
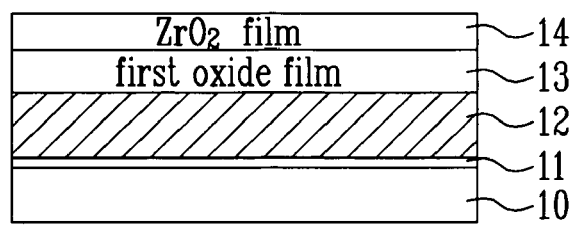

Referring to FIG. 1B, a first oxide film 13 and a $ZrO_2$ film 14 are sequentially formed on the first conductive film 12. The first oxide film 13 may be formed to a thickness of about 30 angstroms to about 60 angstroms using a HTO oxide film by means of a high thermal oxidation method. Furthermore, the $ZrO_2$ film 14 may be formed to a thickness of about 30 angstroms to about 100 angstroms by means of an Atomic Layer Deposition (ALD) method with good step coverage.

Though not shown in the drawings, before or after the $ZrO_2$ film 14 is formed, an $Al_2O_3$ film may be formed in order to form a lamination film of the $Al_2O_3$ film and the $ZrO_2$ film or a lamination film of the $ZrO_2$ film and the $Al_2O_3$ film.

The $Al_2O_3$ film may be formed by the ALD method. The ratio of the thickness of $Al_2O_3$:$ZrO_2$ may be set to range from about 1:9 to about 9:1 and a total thickness of $Al_2O_3$ and $ZrO_2$ may be set to range from about 30 angstroms to about 100 angstroms.

Figure 1C:
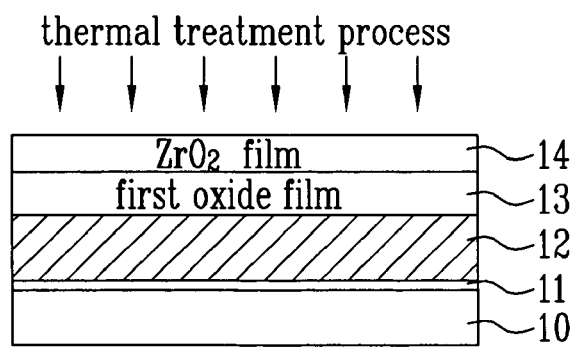

Referring next to FIG. 1C, a thermal treatment process employing $O_2$ plasma is performed in order to make fine the $ZrO_2$ film 14 and fill short oxygen. The thermal treatment process may be performed using power of about 100 W to about 1000 W at a temperature of about 100 C to about 400 C for about 10 seconds to about 60 seconds.

Figure 1D:
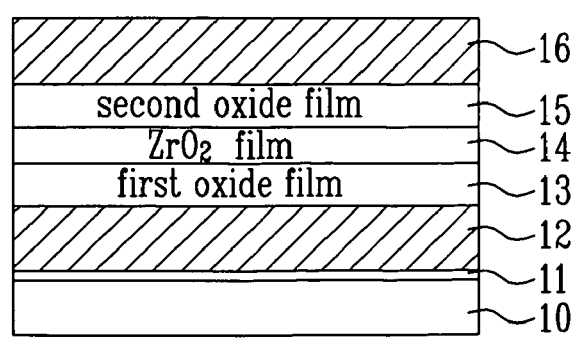

Referring to FIG. 1D, a second oxide film 15 is formed on the $ZrO_2$ film 14, thus forming an inter-gate dielectric film of an OZO structure having a lamination film of the first oxide film 13, the $ZrO_2$ film 14, and the second oxide film 15. The second oxide film 15 may be formed to a thickness of about 30 angstroms to about 60 angstroms using a HTO oxide film by means of the high temperature thermal oxidization method.

Thereafter, a second conductive film 16 is formed on the second oxide film 15. The second conductive film 16 serves as a control gate, and it may be deposited to a thickness of about 500 angstroms to about 2000 angstroms using polysilicon by means of a CVD method.

FIGS. 2A to 2D are cross-sectional views illustrating a method of manufacturing a flash memory cell according to another embodiment of the present invention. In the present embodiment, the process of forming the second oxide film has been omitted.

Figure 2A:
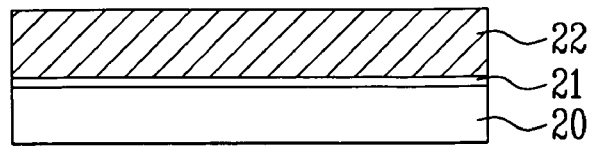
FIGS. 2A to 2D are cross-sectional views illustrating a method of manufacturing a flash memory cell according to another embodiment of the present invention.

Referring first to FIG. 2A, a tunnel oxide film 21 (or tunnel dielectric film 21) and a first conductive film 22 are sequentially formed on a semiconductor substrate 20. The first conductive film 22 serves as a floating gate, and it may be deposited to a thickness of about 500 angstroms to about 2000 angstroms using polysilicon by means of a CVD method.

Figure 2B:
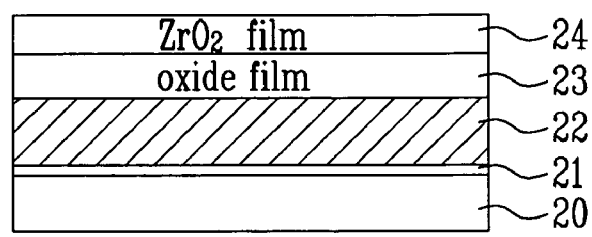

Referring to FIG. 2B, an oxide film 23 and a $ZrO_2$ film 24 are sequentially formed on the first conductive film 22, thus forming a gate dielectric film of an OZ structure having the oxide film 23 and the $ZrO_2$ film 24. Furthermore, the oxide film 23 may be formed using a HTO oxide film by a high thermal oxidation method.

Meanwhile, to secure the same gate dielectric film thickness as that of the gate dielectric film of the OZO structure, the oxide film 23 may be formed to a thickness of about 60 angstroms to about 120 angstroms. The $ZrO_2$ film 24 may be formed to a thickness of about 30 angstroms to about 100 angstroms by means of an ALD method with good step coverage.

Though not shown in the drawings, before or after the $ZrO_2$ film 24 is formed, an $Al_2O_3$ film may be formed in order to form a lamination film of the $Al_2O_3$ film and the $ZrO_2$ film and a lamination film of the $ZrO_2$ film and the $Al_2O_3$ film.

The $Al_2O_3$ film may be formed by an ALD method. The ratio in the thickness of $Al_2O_3$:$ZrO_2$ may be set to range from about 1:9 to about 9:1 and a total thickness of $Al_2O_3$ and $ZrO_2$ may be set to range from about 30 angstroms to about 100 angstroms.

Figure 2C:
Figure 2C:
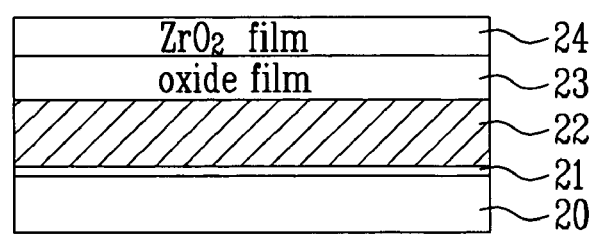

Referring next to FIG. 2C, a thermal treatment process employing $O_2$ plasma is performed in order to make fine the $ZrO_2$ film 24 and fill short oxygen. The thermal treatment process may be performed using power of about 100 W to about 1000 W at a temperature of about 100 Celsius to about 400 Celsius for about 10 seconds to about 60 seconds.

Figure 2D:
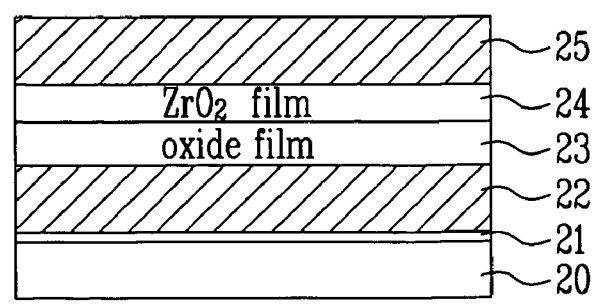

Referring to FIG. 2D, a second conductive film 25 is formed on the $ZrO_2$ film 24. The second conductive film 25 serves as a control gate, and it may be deposited to a thickness of about 500 angstroms to about 2000 angstroms using polysilicon by means of a CVD method.

FIGS. 3A to 3D are cross-sectional views illustrating a method of manufacturing a flash memory cell according to still another embodiment of the present invention. In the present embodiment, the process of forming the first oxide film has been omitted.

Figure 3A:
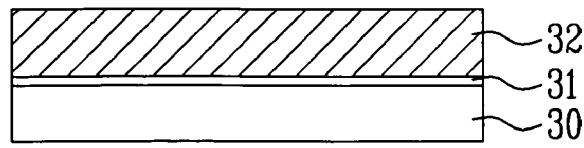
FIGS. 3A to 3D are cross-sectional views illustrating a method of manufacturing a flash memory cell according to still another embodiment of the present invention.

Referring first to FIG. 3A, a tunnel oxide film 31 (or tunnel dielectric film 31) and a first conductive film 32 are sequentially formed on a semiconductor substrate 30. The first conductive film 32 serves as a floating gate, and it may be deposited to a thickness of about 500 angstroms to about 2000 angstroms using polysilicon by means of a CVD method.

Figure 3B:
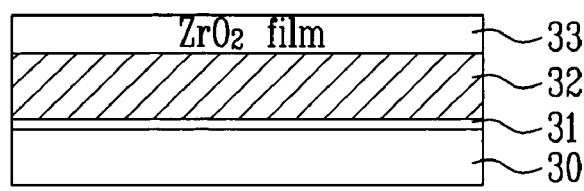

Referring to FIG. 3B, a $ZrO_2$ film 33 is formed on the first conductive film 32. The $ZrO_2$ film 33 may be formed to a thickness of about 30 angstroms to about 100 angstroms by means of an ALD method with good step coverage.

Though not shown in the drawings, before or after the $ZrO_2$ film 33 is formed, an $Al_2O_3$ film may be formed in order to form a lamination film of the $Al_2O_3$ film and the $ZrO_2$ film and a lamination film of the $ZrO_2$ film and the $Al_2O_3$ film, instead of the $ZrO_2$ film 33.

The $Al_2O_3$ film may be formed by an ALD method. The ratio in the thickness of $Al_2O_3$:$ZrO_2$ may be set to range from about 1:9 to about 9:1 and a total thickness of $Al_2O_3$ and $ZrO_2$ may be set to range from about 30 angstroms to about 100 angstroms.

Figure 3C:
Figure 3C:
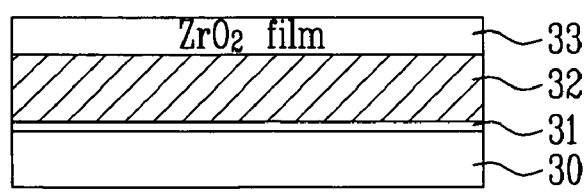

Referring next to FIG. 3C, a thermal treatment process employing $O_2$ plasma is performed in order to make fine the $ZrO_2$ film 33 and fill short oxygen. The thermal treatment process may be performed using power of about 100 W to about 1000 W at a temperature of about 100 Celsius to about 400 Celsius for about 10 seconds to about 60 seconds.

Figure 3D:
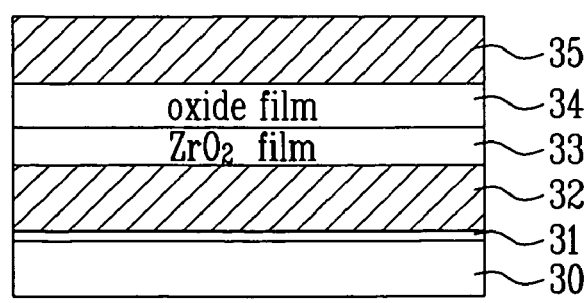

Referring to FIG. 3D, an oxide film 34 is formed on the $ZrO_2$ film 33, thus forming an inter-gate dielectric film of the ZO structure having the lamination film of the $ZrO_2$ film 33 and the oxide film 34.

Meanwhile, to secure the same gate dielectric film thickness as that of the gate dielectric film of the OZO structure, the oxide film 34 may be formed a thickness of about 60 angstroms to about 120 angstroms.

A second conductive film 35 is formed on the oxide film 34.

The second conductive film 35 serves as a control gate, and it may be deposited to a thickness of about 500 angstroms to about 2000 angstroms using polysilicon by means of a CVD method.

The fabrication of the flash memory cell having the gate dielectric film of the ZO structure according to an embodiment of the present invention is thereby completed. As described above, the embodiments of the present invention have one or more of the following advantages. First, the gate dielectric film including the $ZrO_2$ film having a high dielectric constant is formed. It is therefore possible to increase the coupling ratio. Second, since the coupling ratio can be increased, the program and erase rates of devices can be improved. Third, since the gate dielectric film including the $ZrO_2$ film having a high dielectric constant is formed, the occurrence of the leakage current due to a reduction in the thickness of the gate insulating layer can be minimized. Fourth, since the occurrence of the leakage current can be prevented, the reliability of devices can be improved. Fifth, the thickness of the gate dielectric film can made thinner by overcoming the limits of the thinning of the gate insulating layer due to the leakage current. Sixth, the gate dielectric film is not formed using only a high dielectric film, but is formed by laminating the dielectric film having a high dielectric constant with the oxide film. Accordingly, the coupling ratio can be controlled more easily.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A non-volatile memory device comprising:
a tunnel dielectric layer provided over a substrate;
a floating gate formed over the tunnel dielectric film;
a gate dielectric layer formed over the floating gate, the gate dielectric layer comprising a stack structure including a $ZrO_2$ film, an aluminum oxide film and an oxide film, wherein the $ZrO_2$ film contacts the floating gate; and
a control gate formed over the gate dielectric layer.

2. A method of manufacturing a non-volatile memory device, the method comprising:
forming a tunnel dielectric film over a semiconductor substrate;
forming a first conductive layer over the tunnel dielectric film to form a floating gate;
forming a gate dielectric layer over the first conductive layer, the gate dielectric layer comprising a stack structure including a $ZrO_2$ film, an aluminum oxide film and an oxide film, wherein the $ZrO_2$ film contacts the first conductive layer and the aluminum oxide film contacts the oxide film; and
forming a second conductive film over the gate dielectric layer to form a control gate.

3. The method as claimed in claim 2, wherein the first conductive layer is formed to a thickness of 500 angstroms to 2000 angstroms.

4. The method as claimed in claim 2, wherein the first conductive layer comprises a polysilicon layer formed by means of a Chemical Vapor Deposition (CVD) method.

5. The method as claimed in claim 2, wherein forming the gate dielectric layer comprises performing a thermal treatment process of the $ZrO_2$ film.

6. The method as claimed in claim 5, wherein the thermal treatment process is performed in an environment having oxygen plasma for 10 seconds to 120 seconds.

7. The method as claimed in claim 5, wherein during the thermal treatment process, power is set to range from 100 W to 1000 W.

8. The method as claimed in claim 2, wherein the $ZrO_2$ film is formed by an atomic layer deposition method.

9. The method as claimed in claim 2, wherein the $ZrO_2$ film is formed to a thickness of 30 angstroms to 100 angstroms.

10. The method as claimed in claim 2, further comprising forming an $Al_2O_3$ film after formation of the $ZrO_2$ film.

11. The method as claimed in claim 10, wherein the $Al_2O_3$ film is formed by an atomic layer deposition method.

12. The method as claimed in claim 10, wherein the ratio of the thickness of the $ZrO_2$ film and the $Al_2O_3$ film ranges from 1:9 to 9:1.

13. The method as claimed in claim 10, wherein a total thickness of the $ZrO_2$ film and the $Al_2O_3$ film ranges from 30 angstroms to 100 angstroms.

14. The method as claimed in claim 2, wherein the second conductive layer is formed to a thickness of 500 angstroms to 2000 angstroms.

15. The method as claimed in claim 2, wherein the oxide film is formed by a high thermal oxidation method.

16. A non-volatile memory device comprising:
a tunnel dielectric layer provided over a substrate;
a floating gate formed over the tunnel dielectric film;
a gate dielectric layer formed over the floating gate, the gate dielectric layer comprising a stack structure including an $Al_2O_3$ film, a $ZrO_2$ film and an oxide film, wherein the $Al_2O_3$ film contacts the floating gate; and
a control gate formed over the gate dielectric layer.

17. A method of manufacturing a non-volatile memory device, the method comprising:
forming a tunnel dielectric film over a semiconductor substrate;

forming a first conductive layer over the tunnel dielectric film to form a floating gate;

forming a gate dielectric layer over the first conductive layer, the gate dielectric layer comprising a stack structure including an $Al_2O_3$ film, a $ZrO_2$ film and an oxide film, wherein the $Al_2O_3$ film contacts the first conductive layer; and forming a second conductive film over the gate dielectric layer to form a control gate.

18. The method as claimed in claim 2, wherein the aluminum oxide film is located between the $ZrO_2$ film and the oxide film.

* * * * *